(12) United States Patent
Sen et al.

(10) Patent No.: US 11,810,797 B2
(45) Date of Patent: *Nov. 7, 2023

(54) WETTING PROCESSING APPARATUS AND OPERATION METHOD THEREOF

(71) Applicant: PYXIS CF PTE. LTD., Singapore (SG)

(72) Inventors: Amlan Sen, Singapore (SG); Navaneetha Kumaran Baheerathan, Singapore (SG)

(73) Assignee: PYXIS CF PTE. LTD., Singapore (SG)

( * ) Notice: Subject to any disclaimer, the term of this patent is extended or adjusted under 35 U.S.C. 154(b) by 425 days.

This patent is subject to a terminal disclaimer.

(21) Appl. No.: 16/722,438

(22) Filed: Dec. 20, 2019

(65) Prior Publication Data

US 2021/0111045 A1 Apr. 15, 2021

(30) Foreign Application Priority Data

Oct. 14, 2019 (SG) .......................... 10201909599W

(51) Int. Cl.
*H01L 21/67* (2006.01)
*C23F 1/08* (2006.01)

(52) U.S. Cl.
CPC .......... *H01L 21/67086* (2013.01); *C23F 1/08* (2013.01)

(58) Field of Classification Search
CPC ......... Y10T 24/44291; Y10T 24/44299; Y10T 24/44316; F16B 5/0642; B25B 5/12;
(Continued)

(56) References Cited

U.S. PATENT DOCUMENTS 5,437,777 A * 8/1995 Kishi .................. H01L 21/6715
204/224 R
7,727,800 B2 6/2010 Wan et al.
(Continued)

FOREIGN PATENT DOCUMENTS

CN 1572911 A * 2/2005 ............... C25D 5/08
TW I281516 B 5/2007
(Continued)

OTHER PUBLICATIONS

First Office Action dated May 11, 2021, in related Taiwan Application No. 108146656 filed Dec. 19, 2019 (5 pages) with Google machine transiatien (9 pages).
(Continued)

*Primary Examiner* — Parviz Hassanzadeh
*Assistant Examiner* — Margaret Klunk
(74) *Attorney, Agent, or Firm* — Daniel F. Nesbitt; Nesbitt IP LLC

(57) ABSTRACT

A wet processing apparatus and an operation method thereof are provided. The wet processing apparatus includes: a tank body including at least one side wall, the at least one side wall being provided with an opening extending from the inside to the outside of the tank body, and the tank body being configured to accommodate a wet processing solution; and a fixing device configured to fix the substrate at the opening of the side wall. The operation method of the wet processing apparatus includes: placing the substrate on an outer side of the side wall and at the position of the opening, and operating the fixing device to fix the substrate; and performing wet processing treatment on the substrate.

17 Claims, 9 Drawing Sheets

(58) Field of Classification Search
CPC .. B25B 1/14; B25B 5/08; B25B 5/085; B25B 5/087; B25B 5/127
See application file for complete search history.

(56) References Cited

U.S. PATENT DOCUMENTS

| | | | |
|---|---|---|---|
| 8,633,441 B2 | 1/2014 | Wang et al. | |
| 11,261,535 B2* | 3/2022 | Sen | C25D 5/08 |
| 2002/0027080 A1* | 3/2002 | Yoshioka | C25D 21/04 |
| | | | 204/252 |
| 2004/0200214 A1* | 10/2004 | Nomura | B01D 8/00 |
| | | | 60/297 |
| 2004/0245112 A1 | 12/2004 | Sekimoto et al. | |
| 2006/0070883 A1 | 4/2006 | Bejan et al. | |
| 2006/0113185 A1* | 6/2006 | Kuriyama | C25D 17/008 |
| | | | 257/E21.174 |
| 2011/0076144 A1* | 3/2011 | Lucas | F03B 17/067 |
| | | | 416/79 |
| 2015/0068890 A1* | 3/2015 | Yoshioka | C25D 17/06 |
| | | | 204/297.01 |
| 2018/0182659 A1* | 6/2018 | Yokoyama | H01L 21/68764 |

FOREIGN PATENT DOCUMENTS

| | | | | |
|---|---|---|---|---|
| TW | M581289 U | 7/2019 | | |
| WO | WO-2017037757 A1 * | 3/2017 | ............. | C23C 18/31 |

OTHER PUBLICATIONS

U.S. Appl. No. 16/565,589, filed Sep. 10, 2019, Amlan Sen.
U.S. Appl. No. 16/656,863, filed Oct. 18, 2019, Amlan Sen.
Notification Letter of Review Opinion, dated Feb. 4, 2021 by the Taiwan Intellectual Property Office, in related Taiwan Application No. 108127537 filed Aug. 2, 2019 (6 pages) with Google machine translation (3 pages).

* cited by examiner

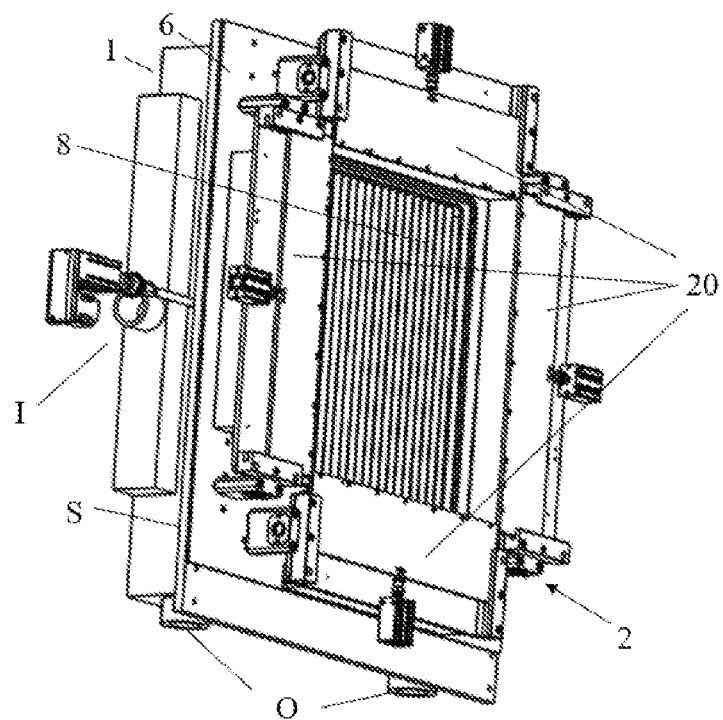
FIG.1 (Abstract)
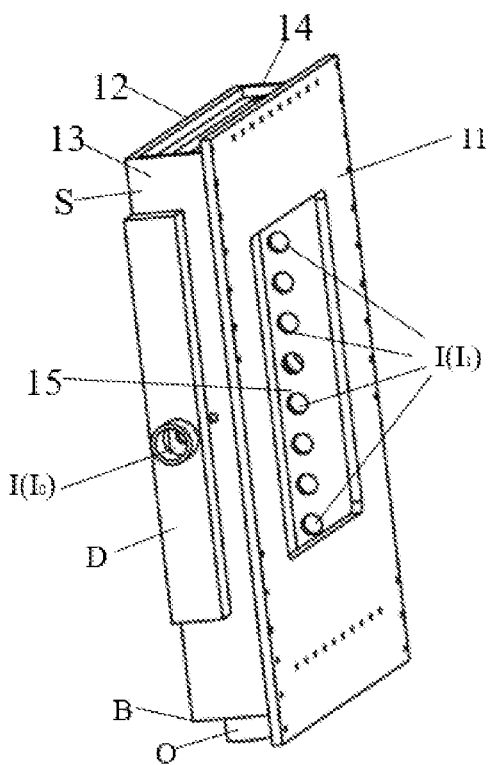
FIG.2

WETTING PROCESSING APPARATUS AND OPERATION METHOD THEREOF

TECHNICAL FIELD

The present disclosure relates to a wet processing apparatus and an operation method thereof.

BACKGROUND

In semiconductor processes, such as a semiconductor packaging, a substrate (also known as substrate to be wet processed) is treated in a wet process (i.e. etching and/or pre-dipping). In the etching process, a etching solution is applied on a treatment surface of the substrate for removing a metal layer or a metal seed layer on the treatment surface, or for forming a rough profile on a metal layer on the treatment surface. In the pre-dipping process, a pre-dipping solution is applied on the treatment surface of the substrate for cleaning the treatment surface, or for wetting the substrate for performing subsequent processes better.

SUMMARY

The present disclosure provides a wet processing apparatus and an operation method thereof. The wet processing in the present application consists of etching and pre-dipping and thus the wet processing apparatus is also known as etching-pre-dipping apparatus. The wet processing apparatus has a simple structure and convenient operation for saving operation time of the substrate mounting process, improving the production efficiency of semiconductor package, and thus the wet processing apparatus is particularly suitable for panel level semiconductor packaging.

A brief summary of the present disclosure is presented below to provide a basic understanding of some aspects of the present disclosure. The content of the present disclosure is not an extensive overview of the present disclosure and is not intended to identify key or critical elements of the present disclosure or the scope of the present disclosure. The following content of the present disclosure reveals some concepts of the present disclosure in a simplified form as a prelude to the specific embodiments provided below.

The present disclosure proposes a wet processing apparatus (i.e. etching-pre-dipping apparatus herein) for performing etching or pre-dipping treatment on a substrate, comprising: a tank body comprising at least one side wall, the at least one side wall being provided with an opening extending from the inside to the outside of the tank body, the tank body being configured to accommodate the etching or pre-dipping solution; and a fixing device configured to fix the substrate at the opening of the side wall.

According to one embodiment of the present disclosure, the fixing device is disposed at the outside of the tank body, so that the fixing device could be operated easily from the outside of the tank body.

According to one embodiment of the present disclosure, a substrate mounting plate fixed on an outer side of the side wall, wherein the substrate mounting plate is provided with a hole and a substrate mounting area arranged around the hole; and a position of the hole of the substrate mounting plate corresponds to a position of the opening of the side wall.

According to one embodiment of the present disclosure, the fixing device is disposed on the substrate mounting plate.

According to one embodiment of the present disclosure, the fixing device comprises two or more clamping pieces arranged on a periphery of the hole of the substrate mounting plate.

Thus, the fixing device can be constructed in a convenient and lightweight manner, and the substrate is fixed on the substrate mounting plate in a fluid seal manner.

At least one part of the clamping piece can move between an extended position and a retracted position at the retracted position of the clamping plate, the substrate can pass through the space above the substrate mounting area without hindrance, thereby allowing convenient operation of placing the substrate on the substrate mounting plate or removing the substrate from the substrate mounting plate.

According to an advantageous embodiment of the present disclosure, the at least one clamping piece comprises a plurality of clamping pieces; and the plurality of clamping pieces are arranged on a periphery of the hole of the substrate mounting plate.

According to a further advantageous embodiment of the present disclosure, the fixing device comprises a first driving mechanism and a second driving mechanism; the first driving mechanism is configured to drive at least a part of the clamping piece along a first direction, so that the at least a part of the clamping piece moves from the side of the substrate mounting area away from the hole to the substrate mounting area, the first direction is parallel to the substrate mounting plate and directed from the side of the substrate mounting area away from the hole to the substrate mounting area; and the second driving mechanism is configured to drive at least a part of the clamping piece along a second direction perpendicular to the substrate mounting plate, so that the at least a part of the clamping piece applies pressure towards the substrate mounting area.

The first driving mechanisms and the second driving mechanism of the plurality of clamping pieces can be connected to a control module, and the control module can respond to an instruction of the operator and simultaneously operate the plurality of clamping pieces. This automated implementation significantly reduces the fixed operation time and reduces the production cost. In addition, the fixing operation by the driving mechanisms is highly reproducible and uniform compared to the manual operation, thereby ensuring the reliability of the fixing operation and the sealing of substrate mounting.

According to one embodiment of the present disclosure, the clamping piece comprises a supporting plate and a clamping plate, the supporting plate comprises a receiving slot; the clamping plate is inserted into the receiving slot and capable of sliding in the receiving slot along the first direction; the first driving mechanism is configured to drive the clamping plate along the first direction, so that the clamping plate extends out of the receiving slot and moves from the side of the substrate mounting area away from the open bore to the substrate mounting area; and the second driving mechanism is configured to drive the clamping plate in the second direction, so that the clamping plate applies pressure towards the substrate mounting area.

According to one embodiment of the present disclosure, the clamping piece comprises a connecting plate disposed on the supporting plate and fixed to the first driving mechanism, the connecting plate comprises a cam slot extending in a direction between the first direction and the third direction to form an angle greater than 0° and less than 90° with the first direction, and a protrusion is fixed on the clamping plate and passes through the supporting plate to cooperate with the cam slot; and wherein the first driving mechanism is configured to drive the connecting plate along a third direction which is parallel to the substrate mounting plate and perpendicular to the first direction, so that the protrusion moves in the cam slot along an extension direction of the cam slot, and the clamping plate slides in the receiving slot of the supporting plate along the first direction.

According to one embodiment of the present disclosure, the fixing device further comprises a pivotal shaft connected to a middle part of the supporting plate; the second driving mechanism is configured to drive an end portion of the supporting plate away from the open bore in the first direction to move away from the substrate mounting plate along the second direction, so that the supporting plate rotates about the pivotal shaft, an end portion of the supporting plate close to the hole in the first direction moves towards the substrate mounting plate along the second direction, and the clamping plate applies the pressure towards the substrate mounting area.

According to one embodiment of the present disclosure, the clamping plate comprises a cantilever element and a clamping end, the cantilever element is configured to be inserted into the receiving slot of the supporting plate; and the clamping end extends from an end of the cantilever element towards the substrate mounting plate and is configured to apply the pressure towards the substrate mounting plate; and in a case that the supporting plate is parallel to the substrate mounting plate, a first distance between the pivotal shaft and the second driving mechanism measured in the first direction is greater than a second distance between the pivotal shaft and the clamping plate measured in the first direction.

According to one embodiment of the present disclosure, the first distance is twice the second distance.

According to one embodiment of the present disclosure, a guide rail extending along the third direction is disposed on the supporting plate and configured to guide the connecting plate to move on the supporting plate along the third direction.

According to one embodiment of the present disclosure, the tank body comprises a plurality of side walls; and the opening is disposed on at least two of the plurality of side walls. Thus, wet processing treatment on a plurality of substrates to be wet processed can be performed simultaneously, thereby obtaining several-times the efficiency of wet processing treatment.

According to one embodiment of the present disclosure, the wet processing apparatus further comprises a substrate stopper which is configured to move from the outside of the opening to a middle part of the opening.

The substrate stopper can comprise a supporting stand connected to the substrate mounting plate and an arm roughly parallel to the substrate mounting plate. The arm can rotate between an idle position outside of the opening and a stop position above the opening in the plane parallel to the substrate mounting plat. Before wet processing treatment, the arm can be disposed at the idle position. In this case, the stop portion is disposed on the outer side of the opening of the side wall, so as to mount and fix the substrate on the substrate mounting plate. During wet processing treatment, the arm can be rotated to the stop position. In this case, the stop portion is disposed in the middle part of the opening of the side wall and stops on the outer side of the substrate to prevent the deformation of the substrate under the pressure of the wet processing solution in the tank body.

According to an advantageous embodiment of the present disclosure, the wet processing apparatus further comprises a cleaning solution conduit at a bottom wall of the tank body for transferring a cleaning solution. The cleaning solution flows into the tank body via the cleaning solution conduit for cleaning the substrate.

According to an advantageous embodiment of the present disclosure, the wet processing apparatus further comprises a wet processing solution drive device disposed in the tank body and facing the opening, and the wet processing solution drive device is configured to drive the wet processing solution to flow towards the opening.

Thus, the wet processing solution near the substrate can be rapidly replenished; the parameters such as temperature, concentration, pH and the like of the wet processing solution in the vicinity of the substrate remains constant; and the chemical composition of the wet processing solution uniformly dispersed. Therefore, the substrate after the etching or the pre-dipping treatment has a more uniform and stable property for improving quality of the wet processing.

According to one embodiment of the present disclosure, the wet processing solution drive device is mounted on the side wall provided with the opening. Due to this configuration, the movement process of the wet processing solution drive device can be implemented in a more stable manner, and the distance from the wet processing solution drive device to the substrate to be wet processed can be accurately controlled.

According to one embodiment of the present disclosure, a distance between the wet processing solution drive device and the side wall provided with the opening is in a range from 2 mm to 4 mm. The placement of the wet processing solution drive device close to the side wall provided with the opening allows to achieve a more uniform treatment effect.

According to one embodiment of the present disclosure, the wet processing solution drive device comprises a plurality of blades arranged and configured to move in a plane parallel to the side wall provided with the opening.

According to one embodiment of the present disclosure, the wet processing solution drive device comprises a sprocket, a plurality of blades, a driving shaft, and a supporting shaft. In particular, the blades are configured to be attached to the sprocket. The sprocket is driven by the driving shaft to move around the driving shaft and the supporting shaft. The sprocket further drives the plurality of blades to move in a certain direction.

The wet processing solution drive device using the plurality of blades, instead of a traditional nozzle structure, does not has various problems inherent to the traditional nozzle structure, such as clogging of the nozzle. Therefore, the wet processing solution drive device does not require frequent maintenances and inspections.

According to one embodiment of the present disclosure, the wet processing solution drive device comprises a plurality of nozzles arranged in an array and configured to move in a plane parallel to the side wall provided with the opening, and the plurality of nozzles are further configured to spray the wet processing solution towards the side wall provided with the opening.

According to one embodiment of the present disclosure, the wet processing apparatus further comprises at least one sealing element disposed in at least one of the following areas: an area of the substrate mounting plate around the hole or an area of the side wall, provided with the opening, around the opening.

According to one embodiment of the present disclosure, a position at which the clamping end applies the pressure towards the substrate mounting plate at least partially overlaps with a position of the sealing element in the direction perpendicular to the substrate mounting plate. Thus, the sealing effect of the sealing element may be improved due to the pressure applied to the sealing element, thereby preventing the leakage of the wet processing solution in the wet processing.

According to one embodiment of the present disclosure, the clamping plate comprises a plurality of clamping ends, and positions at which the plurality of clamping ends apply pressure towards the substrate mounting plate are at least partially overlapped with the position of the sealing element in the direction perpendicular to the substrate mounting plate. Thus, the sealing effect of the sealing element may be further improved.

The present disclosure further proposes an operation method of the above mentioned wet processing apparatus, comprising:

Placing the substrate on the outer side of the side wall and at the position of the opening, and operating the fixing device to fix the substrate; and performing the wet processing treatment on the substrate.

According to one embodiment of the present disclosure, placing the substrate on an outer side of the side wall and at a position of the opening, and operating the fixing device to fix the substrate; and performing the wet processing treatment on the substrate.

According to one embodiment of the present disclosure, performing wet processing treatment on the substrate comprises:

driving the wet processing solution to flow towards the substrate by using the wet processing solution drive device.

BRIEF DESCRIPTION OF THE DRAWINGS

FIG. 1 is an overall schematic diagram of a wet processing apparatus provided by one embodiment of the present disclosure;

FIG. 2 is a perspective view of a tank body in one embodiment of the present disclosure;

REFERENCE NUMERALS OF THE ACCOMPANYING DRAWINGS

Figure 3:
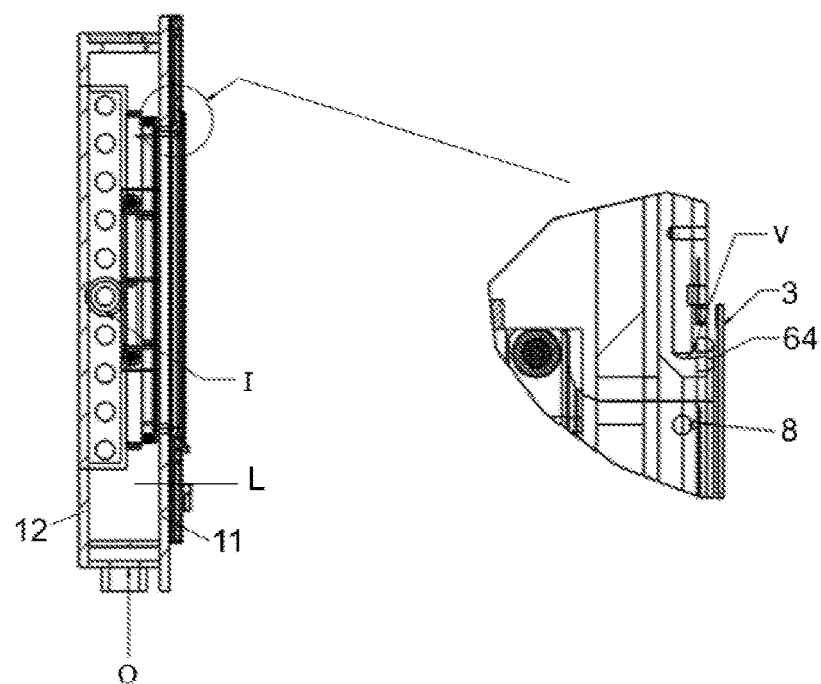
FIG. 3 is a sectional view of the wet processing apparatus as illustrated in FIG. 1.

Tank Body 1; Side Wall S; Bottom Wall B; Front Wall 11; Rear Wall 12; Left Wall 13; Right Wall 14; Opening 15; Wet Processing Solution L; Inlet I; Main Inlet $I_0$; Sub-Inlet $I_1$; Distributor D; Outlet O; Fixing Device 2; Clamping Piece 20; Supporting Plate 21; Through Hole 21h; Receiving Slot 21s; Upper Surface 211; Lower Surface 212; Inner Side Surface 213; Outer Side Surface 214; Front Surface 215; Rear Surface 216; Inner End Portion 217; Outer End Portion 218; Clamping Plate 22; Cantilever Element 23; Protrusion 23p; Clamping End 24; Angle α; Angle β; First Driving Mechanism 71; Second Driving Mechanism 72; Support Member 26; Connecting Plate 27; Cam Slot 27c; Guide Rail 28; Pivotal shaft 29; Pivotal axis P; Supporting Point P1; Longitudinal Axis of Cylinder Q; Extension Axis of Clamping End R; Substrate 3; Substrate Mounting Plate 6; Hole 65; Substrate Mounting Area 6A; Sides of Hole 65a, 65b, 65c, 65d; Seal Ring 64; Wet Processing Solution Drive Device 8; Connecting Frame 81; Blade 82; Slide Bar 83; Duct 84; Holder 85; Pressure Detecting Hole V.

DETAILED DESCRIPTION

The accompanying drawings are referred to in the following description of the exemplary embodiments of the present disclosure. The accompanying drawings form one part of the present disclosure. Various exemplary devices, systems and environments in which various aspects of the present disclosure may be practiced are shown by way of illustration.

In the description of the disclosure, the orientation or positional relationship indicated by "horizontal", "vertical", "upper", "lower", "top", "bottom", "left", "right", "front", "rear" and the like is based on the orientation or positional relationship as illustrated in the accompanying drawings, or the orientation or positional relationship that is conventionally placed when the device set in the present disclosure is used, or the orientation or positional relationship that is conventionally understood by those skilled in the art, is merely for ease of description of the present disclosure and simplified description, which does not indicate or imply that the device or component referred to must have a particular orientation and is constructed and operated in a particular orientation, and thus is not to be construed as a limitation to the present disclosure. In addition, the singular terms "a", "an", and "the" include plural references unless context clearly indicates otherwise. Similarly, the word "or" is intended to include "and" unless the context clearly indicates otherwise.

In some wet processing (i.e. etching or pre-dipping herein) techniques, a transfer device is used to fix the substrate to be wet processed on the transfer device. The substrate is transferred through a spraying device by the transfer device. The spraying device is disposed directly opposite to the substrate, and the treatment surface of the substrate is aligned to face the spraying device. The spraying device thus sprays the wet processing solution to the treatment surface of the substrate through the nozzles. In other words, an etching apparatus and a pre-dipping apparatus have the spraying device for spraying the etching solution and the pre-dipping solution onto the treatment surface of the substrate for etching and pre-diping processing on the substrate, respectively.

In recent years, processes for panel-level semiconductor processing technologies (i.e. a large panel as the substrate for processing multiple semiconductor devices simultaneously) have been explored. Compared with traditional wafer-level processing technologies and single semiconductor processing technologies, the panel-level processing technologies have many advantages such as high productivity and low cost. However, conventional wet processing apparatuses would make transferring the substrate very difficult to conduct in the panel-level technologies, due to a large area of the substrate. In addition, the conventional wet processing apparatuses have a major disadvantage that the wet processing solution may not be easily sprayed uniformly. The wet processing solution sprayed by each nozzle generally presents a fan-shaped region, and thus the fan-shaped regions sprayed by two or more adjacent nozzles would create an overlapping area. The overlapping area has more wet processing solution sprayed from both/all the adjacent nozzles. In contrast, non-overlapping area in the fan-shaped region has less wet processing solution. Therefore, it is very difficult to accurately control the wet processing effect with the conventional wet processing apparatuses. In particular, it is more difficult to spray uniformly on a large panel as the substrate. Moreover, spray nozzles may be easily blocked, which makes maintenance and inspection of the conventional wet processing apparatuses very costly.

FIG. 1 is a schematic diagram of a wet processing (i.e. etching or pre-dipping) apparatus provided by one embodiment of the present disclosure. FIG. 2 is a schematic diagram of a tank body 1 of the wet processing (i.e. etching or pre-dipping) apparatus provided by the present disclosure. As illustrated in FIGS. 1 and 2, the wet processing (i.e. etching or pre-dipping) apparatus comprises a tank body 1 and a fixing device 2. The tank body 1 is, for instance, made from an insulating material and comprises a bottom wall B (FIG. 2) and a plurality of side walls S. An opening 15 for communicating the inside and the outside of the tank body 1 (e.g., extending from the inside to the outside of the tank body) is formed on at least one of the plurality of side walls S. The fixing device 2 is disposed on the outside of the tank body 1 and configured to fix a substrate 3 (shown in FIG. 3) on an outer side of the side wall S and at the position of the opening 15. Thus, the opening 15 allows a treatment surface of the substrate 3 to face the inside of the tank body 1 and to be in contact with a wet processing solution L accommodated in the tank body 1.

The wet processing (i.e. etching or pre-dipping) tank in the present disclosure can have the following advantages:
1. Compared with the conventional wet processing apparatus wherein the substrate is transferred by a complex and bulky transfer device to the spraying device, the wet processing apparatus in the subject application has a simple and compact structure as the substrate is directly mounted on the outer side of the side wall of the tank body. In addition, assembly and disassembly operations of the substrate can also be carried out in a simpler and faster way from the outside of the tank body.
2. The wet processing solution contained in the tank body is communicated with the treatment surface of the substrate installed at the opening of the tank body, so that the wet processing solution is evenly distributed on the treatment surface of the substrate.
3. the wet processing tank in the present disclosure is particularly suitable for processing a large substrate, e.g., a substrate with a size of 600 mm, and thus is particularly suitable for large-sized panel level semiconductor package.

As illustrated in FIG. 2, the plurality of side walls S of the tank body 1 comprise a front wall 11, a rear wall 12, a left wall 13 and a right wall 14. The bottom wall B and the plurality of side walls S define an accommodating space suitable for accommodating the wet processing solution together. The wet processing apparatus can further comprise a wet processing solution pumping device (not illustrated). FIG. 2 only illustrates an example of a tank body provided with four side walls. However, the embodiment of the present disclosure is not limited thereto. For instance, the tank body can comprise less than four side walls or more than four side walls. For instance, side wall parts positioned in the same plane are referred to as one side wall, and side wall parts positioned in different planes are referred to as different side walls.

According to one embodiment of the present disclosure, at least one of the side walls S of the tank body 1 is provided with an opening 15 for communicating the inside and the outside of the tank body 1 (e.g., extending from the inside to the outside of the tank body). The opening 15 can have a shape basically consistent with that of an area to be wet processed of the substrate 3, for instance, a roughly rectangular shape.

In some implementations, one side wall S of the tank body 1 may be provided with the opening 15 that communicates the inner side and the outer side of the tank body 1. For example, in the tank body 1 as shown in FIGS. 1 and 2, the front side wall 11 may be provided with the opening 15 for communicating the inside and the outside of the tank body 1.

In some implementations, at least two of the side walls S of the tank body 1 are provided with the opening 15 for communicating the inside and the outside of the tank body 1. In one embodiment of the present disclosure, the opening 15 for communicating the inside and the outside of the tank body 1 is formed on two opposite side walls S of the tank body 1.

The inside of the tank body 1 can further comprise partition walls. The partition walls and the side walls S of the tank body 1 define a plurality of separate wet processing tank parts in the tank body 1. Each wet processing tank part can correspond to one of the at least two side walls S provided with the openings 15.

According to one embodiment of the present disclosure, at least one of the sidewalls S of the processing tank is provided with an inlet I for the wet processing solution. An outlet O is provided at the bottom wall B of the processing tank. Before the wet processing, the wet processing solution is provided into the tank body 1 through the inlet I; and after the wet processing, the wet processing solution is discharged out of the tank body 1 through the outlet O.

In some implementations, at least one inlet I is provided on each of two opposite side walls S of the tank body 1. For example, as shown in FIG. 2, one inlet is provided on the left wall 13 and another inlet is also provided in the right wall 14.

In some implementations, the inlet I comprises one or more main inlets $I_0$ located on the outside of the side wall, i.e., the side wall faces the outside of the tank; one or more sub-inlets $I_1$ on the inside of the side wall, i.e. the side wall faces the inside of the tank; and a distributor D. The inlet I has more sub-inlets $I_1$ than the main inlet $I_0$, while the main inlet $I_0$ has a larger cross-sectional area than each of the sub-inlet $I_1$. The plurality of main inlets $I_0$ and the plurality of sub-inlets $I_1$ are connected with the distributor D as a single component.

For example, as shown in FIG. 2, a first main inlet 10 is provided on the outside of the side wall of the left wall 13 of the tank body 1, and a plurality of first sub-inlets $I_1$ (not shown) are provided on the inside of the side wall of the left wall 13. Similarly, a second main inlet $I_0$ and a plurality of second sub-inlets $I_1$ (not shown) are also provided on the outside and the inside of the side wall of the right wall 14 of the tank body 1, respectively. The second main inlet $I_0$ on the left wall 13 has an identical or similar shape and size with the first main inlet $I_0$ on the right wall 14; and the second sub-inlet $I_1$ on the left wall 13 has an identical or similar shape and size with the first sub-inlet $I_1$ on the right wall 14. During the wet processing, the wet processing solution flows into the distributor D through the main inlet $I_0$, at one end of the distributor D; and then is dispersed into multiple streams into the tank body 1 by the sub-inlets $I_1$ at an opposite end of the distributor D and opposed to the main inlet $I_0$. Due to the plurality of sub-inlets $I_1$, a resistance is reduced for the solution to flow into the tank body 1; and thus it takes less time for the wet processing solution to flow into the tank body.

In some implementations, a plurality of outlets O are provided at the bottom wall B inside the tank, and/or the outlet has a larger cross-sectional area, so that the wet etching solution can be discharged within a short time (such as 3 seconds). For example, as shown in FIG. 1, two outlets O are provided at the bottom wall B of the tank body 1.

In some implementations, the outlet O is connected to a storage (not shown), and the wet processing solution is stored in the storage for recycling.

In some implementations, the bottom wall B of the tank body 1 has a cleaning solution conduit (not shown). For example, the cleaning solution may be connected to a cleaning solution tank (not shown); and the cleaning solution is stored in the cleaning solution tank. After the wet processing of the substrate with the wet processing solution, the cleaning solution is injected into the wet processing tank from the cleaning solution tank through the cleaning solution conduit for cleaning the substrate, if required. After the cleaning process is completed, the cleaning solution is discharged into the cleaning solution tank through the cleaning solution conduit. The cleaning solution may have a variety of types which is selected according to a specific process. For example, the cleaning is water. The subject disclosure does not limit the type of the cleaning solution. Therefore, the wet processing process and the cleaning process of the substrate may be completed by the wet processing apparatus.

According to one embodiment of the present disclosure, as shown in FIGS. 1 and 2, the left wall 13 and the right wall 14 of the tank body 1 have shorter lateral sides than theses of the front wall 11 and the rear wall 12 of the tank body 1, such that the tank body 1 is thin in thickness. In this way, the wet processing tank may have a small volume for a same substrate. Therefore, the wet processing solution may be filled in the tank 1 within a short time (such as 3 second).

FIG. 3 is a sectional view of the wet processing apparatus showing an enlarged view of a selected region. As illustrated in FIG. 3, the substrate 3 is fixed at the front wall 11 and in contact with the wet processing solution L accommodated in the wet processing tank. The inlet I may be configured at the side wall S of the wet processing tank. The outlet O is configured at the bottom side B of the wet processing tank.

As illustrated in FIG. 1, in some examples, the wet processing apparatus further comprises a substrate mounting plate 6. The substrate 3 is mounted on the substrate mounting plate 6 and fixed on the outer side of the side wall S of the tank body 1. For instance, the substrate mounting plate 6 is disposed between the fixing device 2 and the side wall S. An exemplary structure of the substrate mounting plate 6 will be described below with reference to FIGS. 4 and 5.

Figure 4:
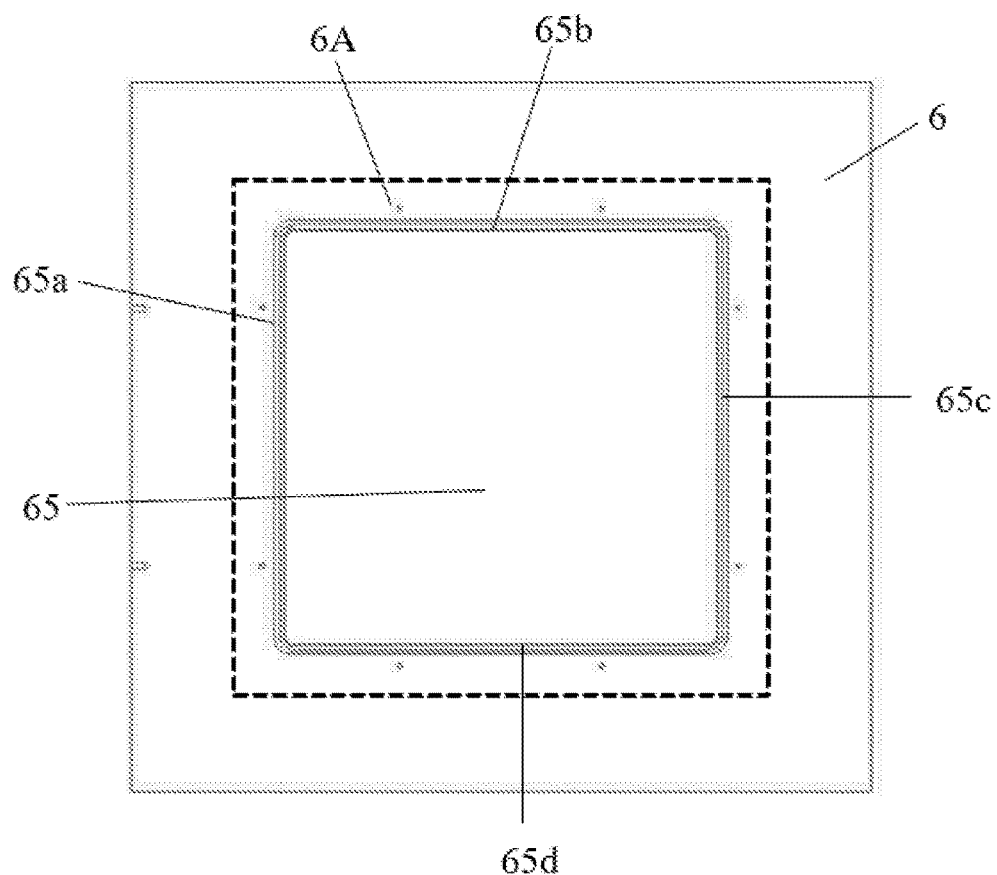
FIG. 4 is a schematic diagram of a substrate mounting plate in one embodiment of the present disclosure.
Figure 5:
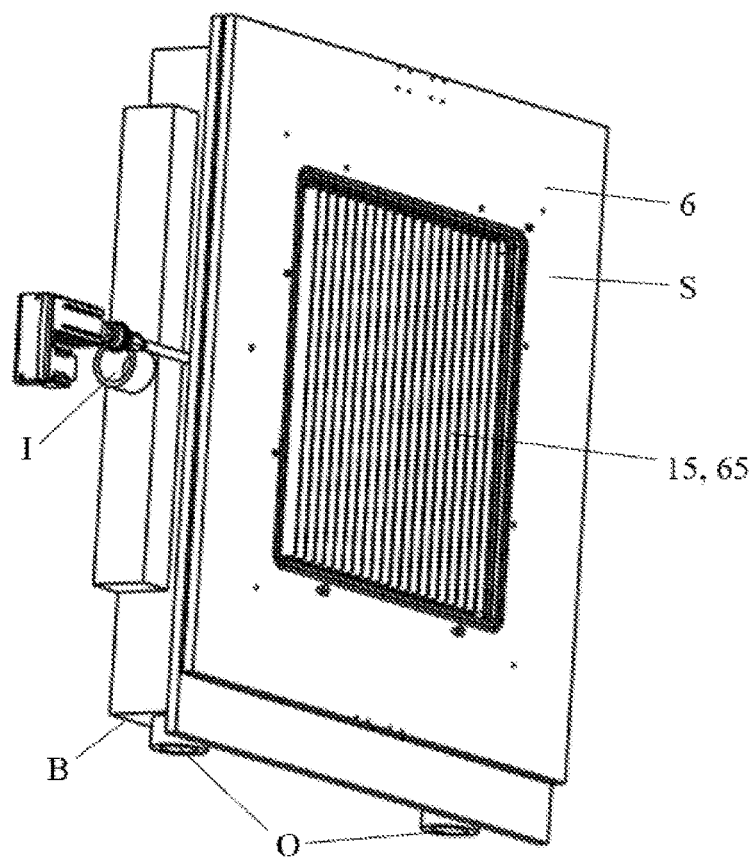
FIG. 5 is a schematic diagram of a wet processing apparatus in one embodiment of the present disclosure.

As illustrated in FIG. 4, the substrate mounting plate 6 is provided with a hole 65. The hole 65 can have a shape substantially consistent with that of the opening 15 of the side wall S or a region to be processed of the substrate 3. In the embodiment as illustrated in FIG. 4, the hole 65 of the substrate mounting plate 6 is of a roughly rectangular shape. The substrate mounting plate 6 is fixed on the outer side of the side wall S provided with the opening 15, so that the position of the hole 65 of the substrate mounting plate 6 can correspond to the position of the opening 15 of the side wall S (as illustrated in FIG. 5). For instance, the shape and the size of the hole 65 of the substrate mounting plate 6 are respectively the same as the shape and the size of the opening 15 of the side wall S, or the shape of the hole 65 of the substrate mounting plate 6 is the same as the shape of the opening 15 of the side wall S but the size of the hole is slightly larger or slightly smaller than the size of the opening of the side wall S, but the embodiment of the present disclosure is not limited thereto. For instance, the phrasing that the position of the hole 65 of the substrate mounting plate 6 "corresponds to" the position of the opening 15 of the side wall S refers to that the areas of the hole 65 and the opening 15 are at least partially overlapped. In some examples, "corresponds to" refers to that the hole 65 and the opening 15 are in a state that the hole 65 and the opening 15 have a maximum overlapping area. In the wet processing process, the surface to be wet processed of the substrate 3 can be exposed in the wet processing solution in the tank body 1 through the hole 65 in the substrate mounting plate 6 and the opening 15 in the side wall S.

In some examples, the fixation between the substrate mounting plate 6 and the side wall S can be a detachable connection through one or more fasteners (for example, screws or bolts). In some examples, the fixation between the substrate mounting plate 6 and the side wall S can be almost permanent connection (e.g., welded joint or adhesive).

The substrate mounting plate 6 is provided with a substrate mounting area 6A (as illustrated by a dotted box part in FIG. 4). The substrate mounting area 6A is arranged around the hole 65 and configured to extend along each side of the hole 65. For instance, when the substrate 3 is mounted on the substrate mounting plate 6, the edge of the substrate 3 laps over the substrate mounting area 6A.

According to one embodiment of the present disclosure, as illustrated in FIG. 1, the fixing device 2 is fixed on the substrate mounting plate 6 and configured to mount the substrate to be wet processed 3 on the substrate mounting area of the substrate mounting plate 6, for instance, by applying pressure to the substrate 3 in the substrate mounting area in the direction towards the side wall 3.

In other embodiments, the fixing device 2 can also be set in a way different from that of the embodiment as illustrated in FIG. 1. Optionally, the fixing device 2 can be directly disposed on the side wall S of the tank body 1. Optionally, the fixing device 2 can be a pressure applying device completely independent of the tank body 1 and the substrate mounting plate 6.

According to one embodiment of the present disclosure, the fixing device 2 comprise at least one clamping piece. In some examples, the fixing device 2 can comprise a plurality of clamping pieces. As illustrated in FIGS. 1, four clamping pieces 20 are disposed on the periphery of the hole 65 of the substrate mounting plate 6 and are respectively distributed at positions close to four sides of the hole 65 of the substrate mounting plate 6. Each clamping piece 20 is configured to apply a pressure to the substrate 3 on a side of the hole 65 along the direction towards the side wall S. Thus, the fixing device can be constructed in a convenient and lightweight manner, and the substrate 3 is fixed on the substrate mounting plate 6 in a fluid seal manner.

An exemplary structure of the clamping piece 20 in one embodiment of the present disclosure will be described below with reference to FIGS. 6 to 10. In the following description, the xyz coordinate system is defined with reference to the substrate mounting plate 6. The z axis is perpendicular to the substrate mounting plate 6, and a positive direction thereof is the direction away from the substrate mounting plate 6. The x axis is perpendicular to the side of the hole 65 of the substrate mounting plate 6, and a positive direction thereof is directed from one side of the substrate mounting area 6A away from the hole 65 to the substrate mounting area 6A, namely directing from the substrate mounting area 6A to the center of the hole 65.

Figure 6:
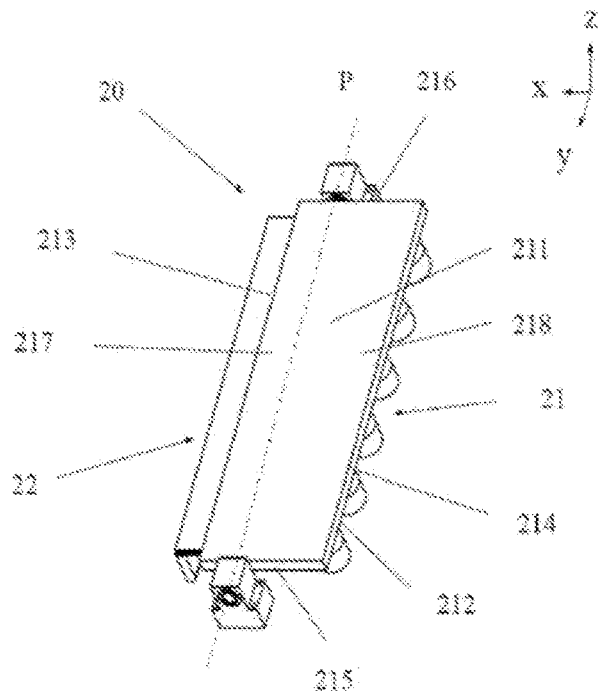
FIG. 6 is a top view perspective diagram of a fixing device in one embodiment of the present disclosure, in which one clamping piece is illustrated.

According to one embodiment of the present disclosure, as illustrated in FIG. 6, the clamping piece 20 can comprise a supporting plate 21 and a clamping plate 22.

The supporting plate 21 is a plate member extending along the length direction, the width direction and the thickness direction. The length direction is parallel to the side of the hole 65 of the substrate mounting plate 6 close to the supporting plate 21. The width direction is perpendicular to the side of the hole 65 of the substrate mounting plate 6 close to the supporting plate 21.

Figure 7:
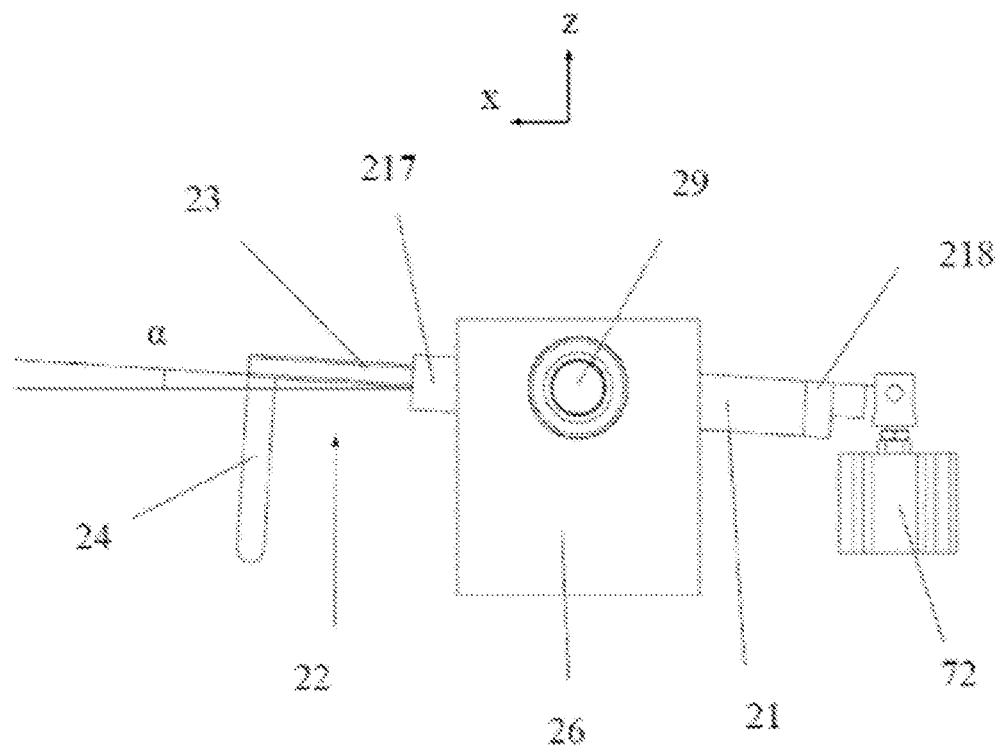
FIG. 7 is a front view schematic diagram of the fixing device in one embodiment of the present disclosure, in which one clamping piece is illustrated.

As illustrated in FIG. 7, the clamping plate 22 is a plate member has an L-like sectional shape and comprises a cantilever element 23 and a clamping end 24 which form two branches of the L-like shape. The clamping end 24 extends from one end of the cantilever element 23 along a direction roughly perpendicular to the extension direction of the cantilever element 23. The clamping end 24 is configured to contact the substrate 3 and apply a pressure to the substrate 3 in the direction towards the substrate mounting plate 6.

For the convenience of description, the geometric characteristics of the supporting plate 21 are defined as follows.

As illustrated in FIG. 6, the supporting plate 21 comprises an upper surface 211 and a lower surface 212, which are opposite to each other and extend in the length direction and the width direction. The lower surface 212 is a surface facing the substrate mounting plate 6, and the upper surface 211 is a surface facing away from the substrate mounting plate 6. The supporting plate 21 comprises an inner side surface 213 and an outer side surface 214, which are opposite to each other and extend in the length direction and the thickness direction. The inner side surface 213 faces the hole 65 of the substrate mounting plate 6, and the outer side surface faces away from the hole 65 of the substrate mounting plate 6. The supporting plate 21 further comprises a front surface 215 and a rear surface 216, which are opposite to each other and extend in the width direction and the thickness direction. The front surface 215 is a surface near the bottom of the image in FIG. 6. The supporting plate 21 comprises two opposite end portions along the width direction which are respectively an inner end portion 217 and an outer end portion 218. The inner end portion 217 terminates at the inner side surface 213, and the outer end portion 218 terminates at the outer side surface 214.

Figure 8:
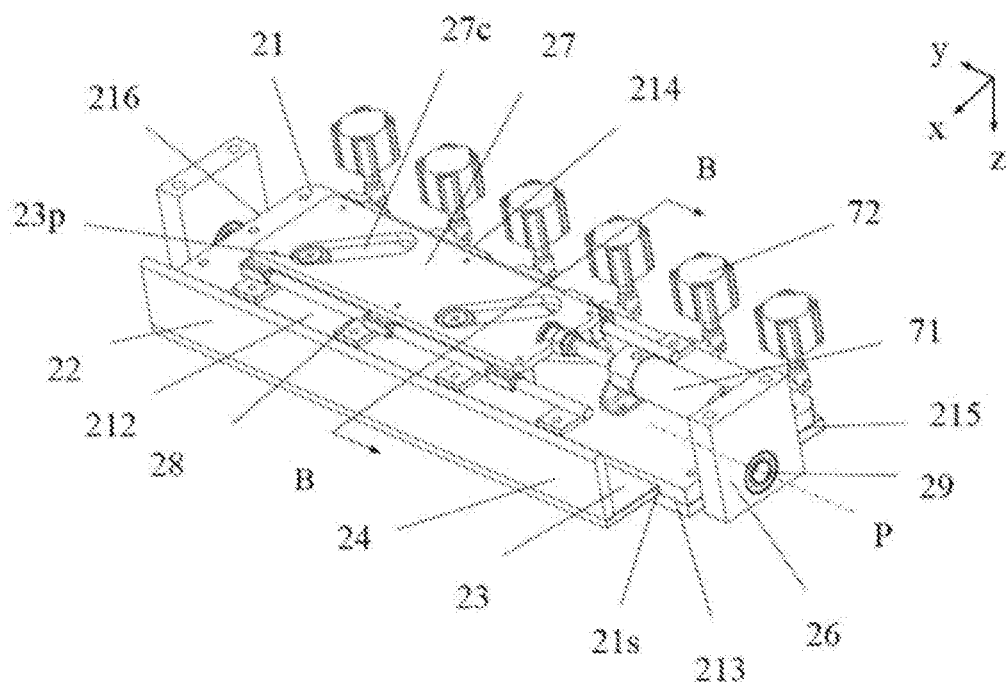
FIG. 8 is a bottom view perspective diagram of the fixing device in one embodiment of the present disclosure, in which one clamping piece is illustrated.
Figure 9:
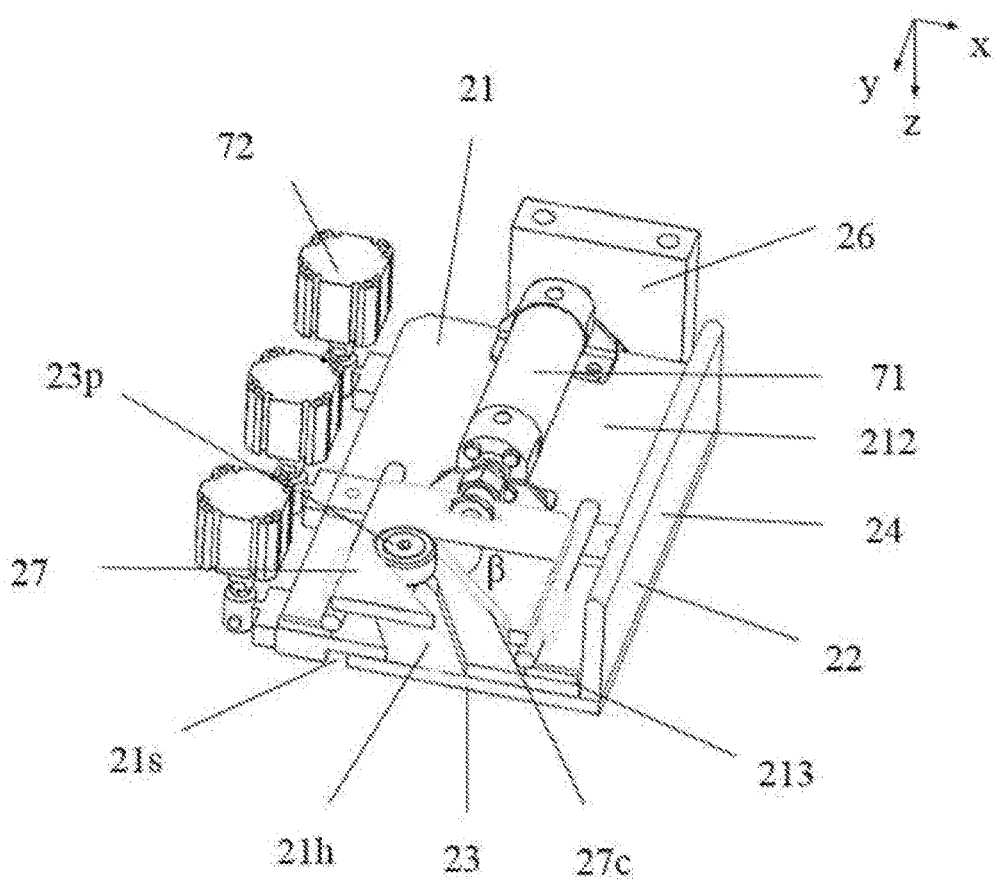
FIG. 9 is a sectional view of the fixing device as illustrated in FIG. 8 along the B-B line.

The supporting plate 21 comprises a receiving slot 21s (as illustrated in FIGS. 8 and 9) which is open on the inner side surface 213. The cantilever element 23 of the clamping plate 22 is inserted into the receiving slot 21s through the opening on the inner side surface 213 of the supporting plate 21. The cantilever element 23 is configured to slide in the receiving slot 21s along the x-axis direction, so that the clamping plate 22 moves between an extension position (referring to FIG. 8) and a retraction position (referring to FIG. 9). The extension position is closer to the center of the hole 65 of the substrate mounting plate 6 along the x-axis direction compared with the retraction position. At the extension position, a part (for instance, the clamping end 24) of the clamping plate 22 can be positioned above the substrate mounting area 6A. At the retraction position, the clamping plate 22 is not positioned above the substrate mounting area 6A. The phrasing of "positioned above the substrate mounting area 6A" indicates that an orthographic projection on the substrate mounting plate 6 is overlapped with the substrate mounting area 6A. Therefore, at the retraction position of the clamping plate 22, the substrate 3 can pass through the space above the substrate mounting area 6A without hindrance, thereby allowing convenient operation of placing the substrate 3 on the substrate mounting plate 6 or removing the substrate 3 from the substrate mounting plate 6.

Figure 10:
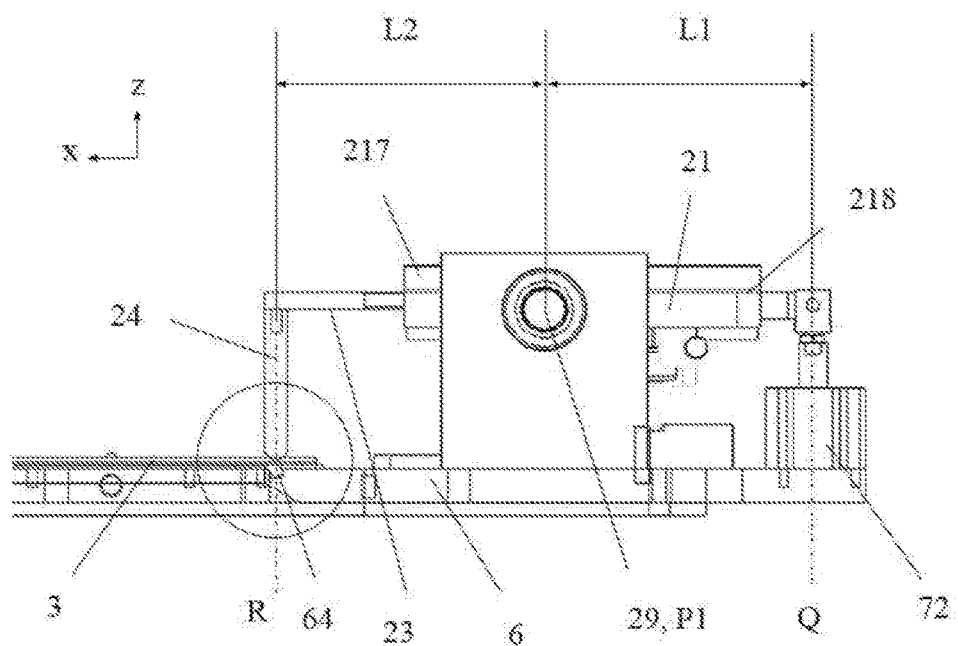
FIG. 10 is schematic diagram of the fixing device from a front view in one embodiment of the present disclosure, in which a substrate mounting plate and a substrate are illustrated.

As illustrated in FIG. 6, the supporting plate 21 is configured to rotate about a pivotal axis P parallel to the y axis, so that the supporting plate 21 can move between an inclination position (as illustrated in FIG. 7) and a parallel position (as illustrated in FIG. 10), and then the clamping end 24 of the clamping plate 22 can move away from or close to the substrate mounting area 6A in the z-axis direction. As illustrated in FIG. 7, at the inclination position, the supporting plate 21 is inclined relative to the substrate mounting plate 6, namely an angle α of greater than 0° and less than 90e is formed between the upper surface 211 (or the lower surface 212) of the supporting plate 21 and the plane of the substrate mounting plate 6, so that the inner end portion 217 of the supporting plate 21 can be farther away from the substrate mounting plate 6 compared with the outer end portion 218. At the inclination position, the clamping end 24 of the clamping plate 22 does not contact the substrate 3 disposed on the substrate mounting plate 6. As illustrated in FIG. 10, at the parallel position, the supporting plate 21 is roughly parallel to the substrate mounting plate 6, and the clamping end 24 of the clamping plate 22 presses against the substrate 3 disposed on the substrate mounting plate 6.

The operation process of the fixing device 2 is as follows: in the case that the wet processing apparatus does not operate, the supporting plate 21 is at the inclination position and the clamping plate 22 is at the retraction position. The operator can place the substrate to be wet processed 3 on the substrate mounting area 6A of the substrate mounting plate 6. After the substrate is placed, the operator can move the clamping plate 22 disposed in the receiving slot 21s of the supporting plate 21 from the retraction position to the extension position, so that the clamping end 24 of the clamping plate 22 can move to the position above the substrate mounting area 6A. The operator can then move the supporting plate 21 from the inclination position to the parallel position, so that the clamping end 24 of the clamping plate 22 can move towards the substrate mounting area 6A and apply a pressure to the substrate 3, and the substrate 3 is therefore fastened on the substrate mounting plate 6 in the substrate mounting area 6A.

In a variant example not illustrated of the present disclosure, the clamping piece 20 can be a plate member in which a pressing portion is fixed at one end, and can move in the x-axis direction and the z-axis direction integrally under the guidance of, for example, a guide rail. In the process of mounting the substrate 3, the clamping piece 20 can move along a guide rail extending along the x-axis direction towards the center of the hole 65 at first, so that the pressing portion can be disposed above the substrate mounting area 6A. Different from the pivotal motion around the y axis of the supporting plate 21 in the above embodiment, in this embodiment, the clamping piece 20 can integrally perform a linear movement towards the substrate mounting plate 6 along a guide rail 28 (refer to FIG. 8) extending along the z-axis direction, so that the pressing portion can apply a pressure to the substrate 3 on the substrate mounting area 6A.

As for the design of the clamping piece 20, the principle followed by the present disclosure is that at least one part of the clamping piece 20 can move in the x-axis direction and the z-axis direction. Firstly, at least one part of the clamping piece 20 can move in the x-axis direction between one side of the substrate mounting area 6A away from the hole 65 (corresponding to the above retracted position) and the substrate mounting area 6A (corresponding to the above extended position), so as to leave an operation space for the placement and removal of the substrate 3 above the substrate mounting area 6A. Secondly, at least one part (for instance, the clamping end 24) of the clamping piece 20 can move in the z-axis direction, so as to press against the substrate 3 disposed on the substrate mounting plate 6 and apply a pressure to the substrate, or release the pressure and leave from the substrate 3. Under the guidance of this principle, other structural designs and movement modes of the clamping piece 20 can be envisioned by those skilled in the art without departing from the scope of protection of the present disclosure.

According to one embodiment of the present disclosure, the fixing device 2 further comprises driving mechanisms which are configured to drive the motion of the clamping piece 20.

In some examples, the fixing device 2 comprises a first driving mechanism 71 and a second driving mechanism 72. The first driving mechanism 71 is configured to drive at least one part of the clamping piece 20 along the x-axis direction, so that the at least one part of the clamping piece 20 can move from one side of the substrate mounting area 6A away from the hole 65 to the substrate mounting area 6A. The second driving mechanism 72 is configured to drive at least one part of the clamping piece 20 along the z-axis direction, so that the at least one part of the clamping piece 20 can apply a pressure towards the substrate mounting area 6A.

It should be noted that "the first driving mechanism 71 drives at least one part of the clamping piece 20 along the x-axis direction" is not limited to the case where the movement trajectory of the at least one part of the clamping piece 20 is along the x-axis direction. The at least one part of the clamping piece 20 can also move along a direction that is at an angle to the x-axis direction driven by the first driving mechanism 71. For instance, in a state where the clamping piece 20 is at, for example, the inclination position as illustrated in FIG. 7, the movement direction of the at least one part of the clamping piece 20 forms a certain angle with the x-axis direction. "The first driving mechanism 71 drives the at least one part of the clamping piece 20 along the x-axis direction" should be understood as that the motion of the at least one part of the clamping piece 20 contains a motion component along the x-axis direction.

The driving mechanism can be any of a variety of linear drive units known to those skilled in the art, e.g., an electric motor, a cylinder or a ball screw. The first driving mechanisms 71 and the second driving mechanism 72 of the plurality of clamping pieces 20 can be connected to a control module, and the control module can simultaneously operate the plurality of clamping pieces 20 in response to an instruction of the operator. This automated implementation significantly reduces the fixed operation time and reduces the production cost. In addition, the fixing operation by the driving mechanisms is highly reproducible and uniform compared to manual operation, thereby ensuring the reliability of the fixing operation and the sealing effect of substrate mounting.

FIGS. 8-10 illustrate in detail the first driving mechanism 71 and the second driving mechanism 72 in one embodiment of the present disclosure. As an example, both the first driving mechanism 71 and the second driving mechanism 72 are in the form of a cylinder, and the cylinder can comprise a cylinder barrel and a piston rod capable of performing linear reciprocating motion in the cylinder barrel.

FIG. 8 is a bottom view perspective diagram of the fixing device 2 in the present disclosure (observed from the lower surface 212 of the supporting plate 21). FIG. 9 is another bottom view perspective diagram of the fixing device 2 in the present disclosure illustrated in a sectional form (observed from the lower surface 212 of the supporting plate 21).

The fixing device 2 can comprise two support members 26 respectively disposed at the front surface 215 and the rear surface 216 of the supporting plate 21. The first driving mechanism 71 is configured such that the cylinder barrel thereof is fixed at one of the support members 26 and the longitudinal axis of the cylinder barrel extends along the y-axis direction, so that the piston rod of the first driving mechanism 71 can perform linear reciprocating motion along the y-axis direction.

Apart from the supporting plate 21 and the clamping plate 22, the clamping piece 20 further comprises a connecting plate 27 which is disposed on the lower surface 212 of the supporting plate 21 and fixedly connected to an end portion of the piston rod of the first driving mechanism 71. The guide rail 28 extending along the y-axis direction can also be disposed on the lower surface 212 of the supporting plate 21. Thus, the linear motion along the y-axis direction of the connecting plate 27 can be guided along the guide rail 28.

The connecting plate comprises at least one cam slot 27c. The cam slot 27c is of an elongated shape, for instance, an oblong shape, and an extension axis thereof is between the x axis and the y axis and forms an angle of larger than 0° and smaller than 90° with the x axis (FIG. 9). In the embodiment as illustrated in FIG. 8, two cam slots 27c are provided.

As illustrated in FIGS. 8 and 9, the cantilever element 23 of the clamping plate 22 can be provided with a cylindrical protrusion 23p. The protrusion 23p passes through the supporting plate 21 and engages with the cam slot 27c of the connecting plate 27. Thus, the supporting plate 21 can be provided with a through hole 21*h* for the protrusion 23*p* to move freely therein (FIG. 9), and the through hole 21*h* communicates the receiving slot 21*s* of the supporting plate 21 and the lower surface 212 of the supporting plate 21 (e.g., extends from the receiving slot 21*s* of the supporting plate 21 to the lower surface 212 of the supporting plate 21). In the embodiment as illustrated in FIG. 8, two protrusions 23*p* are provided.

In the case that the connecting plate 27 performs linear motion along the y axis driven by the first driving mechanism 71, the connecting plate 27 drives the protrusion 23*p* to move in the cam slot 27*c* along the extension axis of the cam slot 27*c*, so that the clamping plate 22 can slide in the receiving slot 21*s* of the supporting plate 21 along the x-axis direction and thus move between the extension position and the retraction position.

FIG. 8 illustrates the clamping plate 22 disposed at the extension position, and FIG. 9 illustrates the clamping plate 22 disposed at the retracted position. Starting from the position as illustrated in FIG. 8, when the first driving mechanism 71 drives the connecting plate 27 to move towards the positive direction of the y axis, the protrusion 23*p* moves along the extension axis of the cam slot 27*c* from a position in the cam slot 27*c* closest to the center of the hole 65 to a position in the cam slot 27*c* farthest from the center of the hole 65, so that the clamping plate 22 can move to the retraction position as illustrated in FIG. 9. Reversely, starting from the position as illustrated in FIG. 9, when the first driving mechanism 71 drives the connecting plate 27 to move towards the negative direction of the y axis, the protrusion 23*p* moves along the extension axis of the cam slot 27*c* from the position in the cam slot 27*c* farthest from the center of the hole 65 to the position in the cam slot 27*c* closest to the center of the hole 65, so that the clamping plate 22 can move to the extension position as illustrated in FIG. 8.

As illustrated in FIG. 10, the second driving mechanism 72 is configured such that the cylinder barrel thereof is fixed on the substrate mounting plate 6 and the longitudinal axis of the cylinder barrel extends along the z axis direction, so that the piston rod of the second driving mechanism 72 can perform linear reciprocating motion along the z-axis direction. The outer end portion 218 of the supporting plate 21 is fixedly connected to the end portion of the piston rod of the second driving mechanism 72.

Returning to FIG. 8, the supporting plate 21 can comprise a pivotal shaft 29 protruding from the front surface 215 and the rear surface 216 thereof, so as to define a pivotal axis P. The support member 26 is provided with a mounting hole, and the pivotal shaft 29 of the supporting plate 21 can be inserted into the mounting hole of the support member 26. The mounting hole can also be provided with a bearing for supporting the rotating pivotal shaft 29 in the mounting hole. In some examples, the pivotal shaft is connected to the middle part of the supporting plate, and the middle part refers to the position between the inner end portion and the outer end portion of the supporting plate. In some examples, the pivotal shaft 29 is disposed at a roughly middle position of the supporting plate 21 in the width direction.

In the case that the outer end portion 218 of the supporting plate 21 performs linear motion along the z axis driven by the second driving mechanism 72, the supporting plate 21 can rotate about the pivotal shaft 29, so that the supporting plate 21 can move between the parallel position and the inclination position.

In the embodiment as illustrated in FIG. 10, in a state where the supporting plate 21 is at the parallel position, as measured along the x-axis direction, the first distance L1 between the pivotal shaft 29 and the second driving mechanism 72 is greater than the second distance L2 between the pivotal shaft 29 and the clamping end 24 of the clamping plate 22. As observed in the xz plane, the pivotal axis P of the pivotal shaft 29 and the xz plane intersect at a supporting point P1, and the supporting point P1 is point of support of the lever motion of the clamping piece. The first distance L1 between the pivotal shaft 29 and the second driving mechanism 72 refers to the distance between the supporting point P1 and a longitudinal axis Q of the cylinder barrel of the second driving mechanism 72 along the x-axis direction. The second distance L2 between the pivotal shaft 29 and the clamping end 24 of the clamping plate 22 refers to the distance between the supporting point P1 and an extension axis R of the clamping end 24 of the clamping plate 22 along the x-axis direction.

Thus, the force applied by the second driving mechanism 72 can be amplified through the lever principle, so that the fixing of the substrate 3 at the clamping end 24 of the clamping plate 22 can be more stable, thereby enhancing the sealing effect and preventing the leakage of the wet processing solution during the wet processing process.

In some examples, the first distance L1 is twice the second distance L2.

FIG. 7 illustrates the fixing device 2 of which the supporting plate 21 is at the inclination position and the clamping plate 22 is at the extension position. FIG. 10 illustrates the fixing device 2 of which the supporting plate 21 is at the parallel position and the clamping plate 22 is at the extension position. Starting from the position as illustrated in FIG. 7, when the second driving mechanism 72 drives the outer end portion 218 of the supporting plate 21 along the positive direction of the z axis, the supporting plate 21 can rotate about the pivotal shaft 29 until arriving at the parallel position as illustrated in FIG. 10. During this process, the inner end portion 217 of the supporting plate 21 and the clamping end 24 of the clamping plate 22 roughly moves along the negative direction of the z axis. At the parallel position as illustrated in FIG. 10, the second driving mechanism 72 drives the outer end portion 218 of the supporting plate 21 along the positive direction of the z axis, so that the clamping end 24 of the clamping plate 22 can apply a pressure to the substrate 3 in the substrate mounting area 6A along the negative direction of the z axis. Thus, the substrate 3 is firmly mounted on the substrate mounting plate 6.

In some examples, the pivotal shaft 29 of the supporting plate 21 can be arranged in a manner different from that of the above embodiment. For instance, the pivotal shaft 29 can be disposed on the outer end portion 218 of the supporting plate 21 in the width direction, and the end portion of the piston rod of the second driving mechanism 72 is connected to the middle part of the supporting plate 21 in the width direction.

According to one embodiment of the present disclosure, as illustrated in FIG. 8, the second driving mechanism 72 can comprise a plurality of cylinders which are equidistantly distributed in the length direction of the supporting plate 21. As a result, the driving force of the second driving mechanism 72 applied to the outer end portion of the supporting plate 21 can be uniformly distributed in the length direction of the supporting plate 21. Thus, the fixing force applied to the substrate 3 can be uniformly distributed along the side of the substrate mounting area 6A, thereby ensuring the sealing contact between the substrate 3 and the substrate mounting plate 6 at different positions.

According to one embodiment of the present disclosure, the wet processing apparatus further comprises a substrate stopper (not illustrated) which is configured to move from the outer side of the opening to the middle part of the opening. According to one embodiment of the present disclosure, the substrate stopper comprises a supporting stand connected to the substrate mounting plate and an arm roughly parallel to the substrate mounting plate. An articulating member can be disposed at one end of the arm and engage with a receiving hole in the supporting stand, so as to define an articulating axis of the arm. The articulating axis is perpendicular to the substrate mounting plate. A stop portion can be connected to one end of the arm and is, for instance, formed into a thin piece parallel to the substrate mounting plate. Thus, the arm can rotate about the articulating axis between an idle position at the outer side of the opening and a stop position above the opening in the plane parallel to the substrate mounting plate. In some examples, an adjusting device, for instance, an adjusting bolt, of the stop portion can be disposed on the arm at one end of the stop portion and is configured to adjust the distance between the stop portion and the substrate mounting plate. Thus, the stop portion can be adjusted to a position away from the substrate mounting plate in the rotation process of the arm, thereby avoiding the collision with other units, for instance, the fixing device, on the substrate mounting plate.

Before wet processing treatment, the substrate stopper can be disposed at the idle position. In this case, the stop portion is positioned on the outer side of the opening of the side wall S, so that the substrate can be mounted and fixed on the substrate mounting plate. During wet processing treatment, the arm can be rotated to the stop position. In this case, the stop portion is positioned in the middle part of the opening of the side wall S and blocks at the outer side of the substrate to prevent the deformation of the substrate under the pressure of the wet processing solution L in the tank body.

Figure 11:
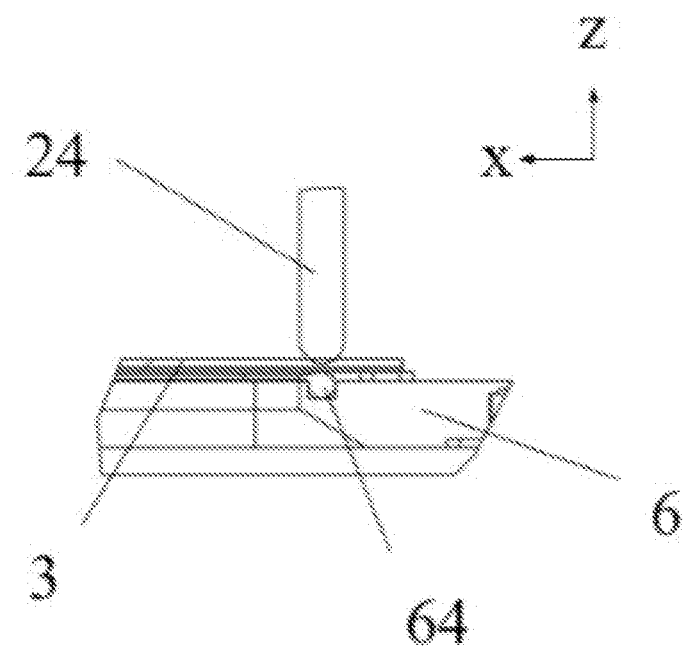
FIG. 11 is a partial enlarged view of a clamping end as illustrated in FIG. 10.
Figure 12:
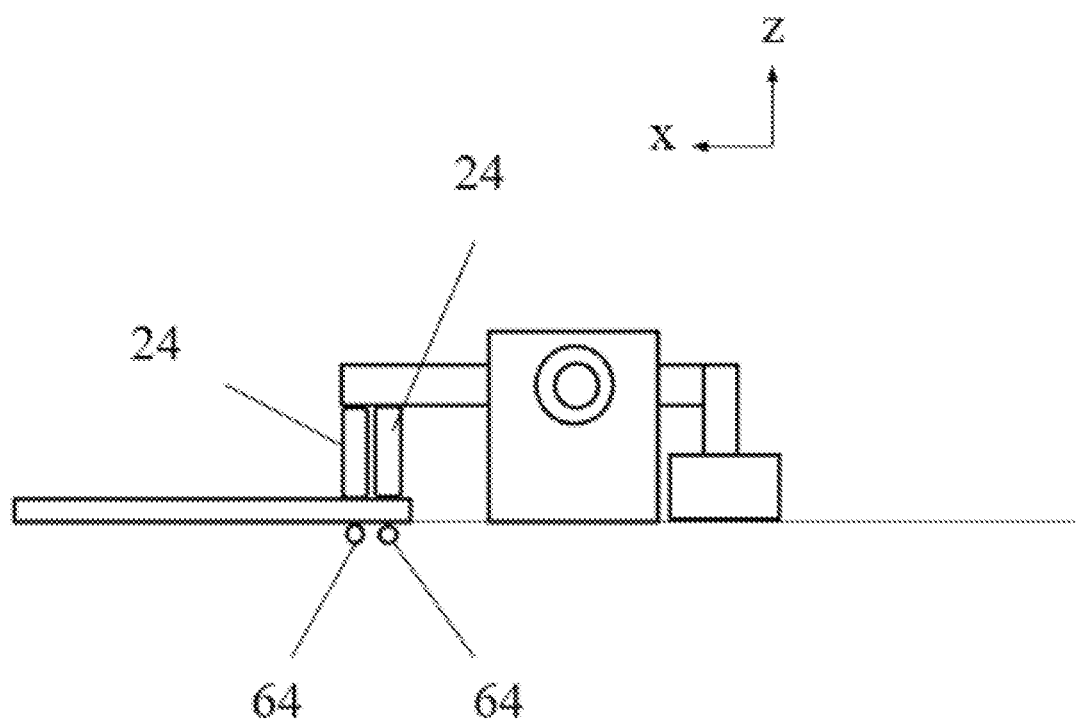
FIG. 12 is a front view schematic diagram of a fixing device in another embodiment of the present disclosure.

In some examples, as illustrated in FIGS. 10 to 12, the wet processing apparatus further comprises at least one sealing element. The sealing element can be disposed at an area of the substrate mounting plate 6 around the hole 65, so as to ensure a good sealing between the substrate 3 and the substrate mounting plate 6. The sealing element can further be disposed at an area of the side wall S around the opening 15, so as to ensure a good sealing between the side wall S and the substrate mounting plate 6.

In one embodiment of the present disclosure, as illustrated in FIG. 10, the sealing element is the form of a seal ring 64. The substrate mounting plate 6 can be provided with a recessed portion for accommodating the seal ring 64. In some examples, as illustrated in FIG. 10, the recessed portion is open towards the outer side of the substrate mounting plate, so as to ensure the good sealing between the substrate 3 and the substrate mounting plate 6. In some examples (not illustrated), the recessed portion is open towards the inner side of the substrate mounting plate, so as to ensure the good sealing between the side wall S and the substrate mounting plate 6. In some examples (not illustrated), a recessed portion for accommodating the seal ring 64 can be disposed on the outer side of the side wall S, so as to ensure the good sealing between the side wall S and the substrate mounting plate 6. In another embodiment of the present disclosure (not illustrated), the seal ring is in the form of a gasket; the gasket can be of a rectangular shape provided with a hollow part. The shape and the size of the hollow part are, for instance, substantially consistent with those of the hole 65 of the substrate mounting plate 6 or the opening 15 of the side wall S. The gasket is placed between the substrate 3 and the substrate mounting plate 6 and/or between the substrate mounting plate 6 and the side wall S.

As illustrated in the partial schematic diagram FIG. 11, the position of the sealing element is set such that: when the supporting plate 21 is at the parallel position, the position of the clamping end 24 of the clamping plate 22 at which the pressure is applied to the substrate mounting plate 6 at least partially overlaps with the position of the sealing element along the z axis. Thus, the sealing effect of the sealing element can be improved due to the pressure applied to the sealing element, thereby preventing the leakage of the wet processing solution L in the wet processing process.

In order to further improve the sealing effect, as illustrated in FIG. 12, the clamping plate 22 of the clamping piece 20 of the fixing device 2 can comprise a plurality of clamping ends 24. Correspondingly, the sealing elements can be distributed at positions where the plurality of clamping ends 24 exert the pressure towards the substrate mounting plate 6. When the sealing element is in the form of the seal ring 64, a plurality of seal rings 64 can be disposed at different positions from the side of the hole 65. When the sealing element is in the form of the gasket, the plurality of clamping ends 24 can apply the pressure at different positions of the gasket from the side of the hole 65.

It should be noted that although the sealing element is in the form of the seal ring 64 in FIGS. 11 and 12, the present disclosure is not limited thereto. As described above, the sealing element can also adopt the form of the gasket. When the supporting plate 21 is at the parallel position, an orthographic projection of the position where the clamping end 24 of the supporting plate 22 exerts the pressure towards the substrate mounting plate 6 on the substrate mounting plate 6 falls within an orthographic projection of the gasket on the substrate mounting plate 6.

Referring back to FIG. 3. In some examples as shown in the enlarged view in FIG. 3, the wet processing apparatus further comprises a pressure detecting hole V, and a position of the pressure detecting hole V in the wet processing apparatus is aligned with a position of the seal ring 64. The air pressure detecting hole V is connected to a pressure detection device (not shown) for detecting an air pressure around the seal ring 64 to determine whether the substrate 3 is connected to the wet processing apparatus stably.

The wet processing apparatus further comprises a wet processing solution drive device 8 disposed in the tank body 1. As illustrated in FIG. 1, the wet processing solution drive device 8 is set to face the opening 15 on the side wall S and configured to drive the wet processing solution L to flow towards the opening 15. Thus, the wet processing solution L near the substrate 3 can be rapidly replenished, the parameters such as temperature, concentration, pH and the alike of the wet processing solution L in the vicinity of the substrate 3 remains constant, and the chemical composition of the wet processing solution L is uniformly dispersed for making the wet processing more uniformly.

Figure 13:
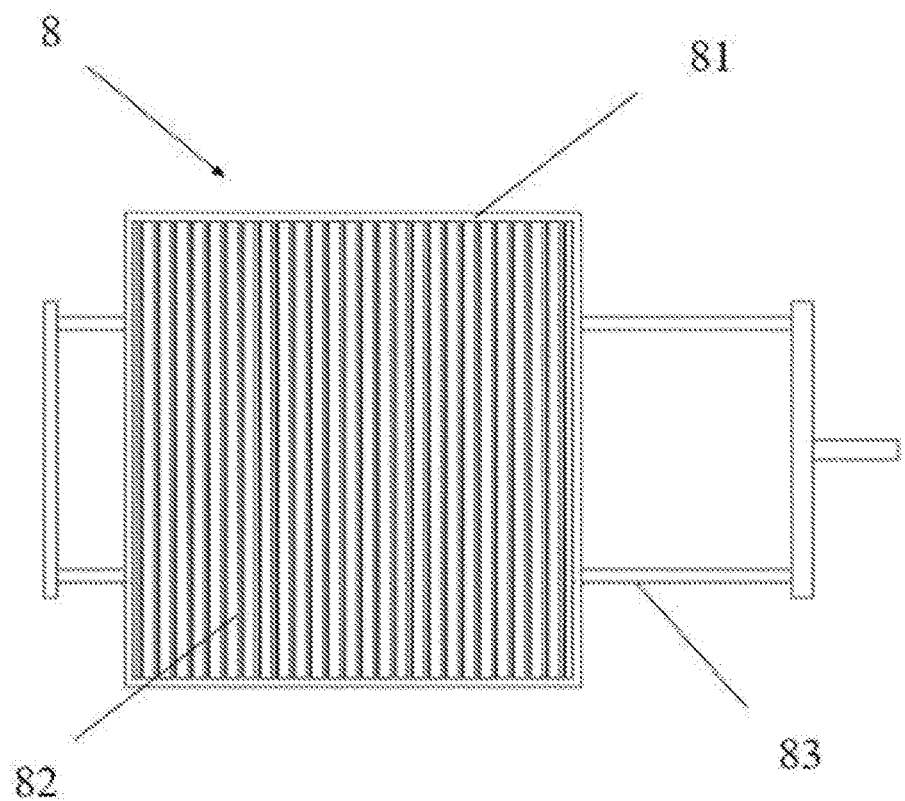
FIG. 13 is a schematic diagram of a wet processing solution drive device in one embodiment of the present disclosure.

According to one embodiment of the present disclosure, as illustrated in FIG. 13, the wet processing solution drive device 8 comprises a connecting frame 81 and a plurality of blades 82 connected to the connecting frame 81, and the plurality of blades 82 are, for instance, formed as mutually parallel grids. The connecting frame 81 and the plurality of blades 82 are arranged in a plane parallel to the side wall S provided with the opening 15 (as illustrated in FIG. 1). The connecting frame 81 can be connected to a drive device via a slide bar 83. The drive device can drive the connecting frame 81 and the plurality of blades 82 to move in a plane parallel to the side wall S, for instance, performing reciprocating movement along the horizontal direction or the vertical direction, thereby driving a flow of the wet processing solution L in the vicinity of the substrate 3.

In some embodiments, the wet processing solution drive device having a plurality of blades may be provided in a different configuration from that shown in FIG. 13. The wet processing solution drive device may include a sprocket and a plurality of blades attached to the sprocket; and the wet processing solution drive device optionally further includes a driving shaft and a supporting shaft which may have shapes similar to a rod. Optionally, the driving shaft and the supporting shaft are arranged in parallel configuration, each of which has a top end and a bottom end opposite to the top end. Optionally, the bottom ends are provided on the bottom wall of the tank body. The driving shaft and the supporting shafts are substantially perpendicular to the bottom wall of the tank. In some implementations, an imagative plane comprising the driving shaft and the supporting shaft is substantially parallel to the opening. And the imagative plane is also aligend with the opening. For example, at least a portion of opening overlapps with the imagative plane. For another example, the opening falls within the imagative plane as a whole. Optionally, the sprocket comprises a first sprocket and a second sprocket. The first sprocket and the second sprocket are coiled in a deformed ring configuration around the top ends and the bottom ends respectively of both the driving shaft and the supporting shaft. The distance between the driving shaft and the supporting shaft is defined as a long dimension of the flat ring. In some implementations, a top end and a bottom end of each blade are attached to the first sprocket and the second sprocket, respectively. Optionally, each blade is configured to be substantially parallel to the driving shaft and the supporting shaft. Driven by the driving shaft, the sprocket (including the first sprocket and the second sprocket) makes a circumferential movement (such as rotate) between the driving shaft and the supporting shaft, and thereby drives the blades to rotate in a same direction around the driving shaft and the supporting shaft, i.e., in a clockwise direction or in a counter clockwise direction of the circumferential movement. As a result, the blades drive the wet processing solution to form a stable laminar flowing movement in the tank body for preventing any excessive turbulent flowing movement, thereby making the wet processing more stable. The wet processing solution drive device adopting a plurality of blades does not need to use a nozzle structure, and thus solves the problem of blocking (such as clogging) the nozzle, and thus reduces the cost of maintenance and inspection.

Figure 14:
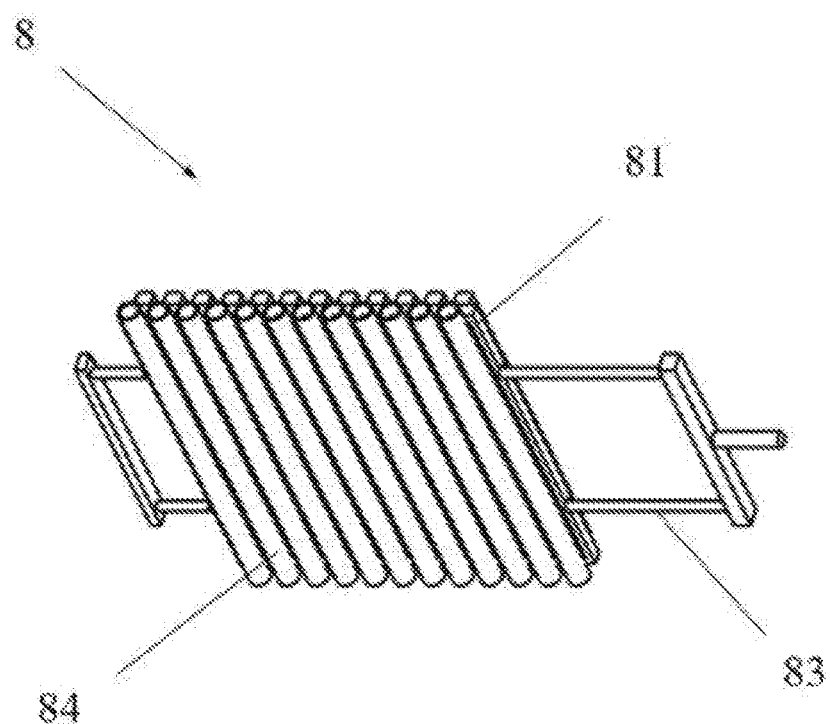
FIG. 14 is a schematic diagram of a wet processing solution drive device in another embodiment of the present disclosure.

According to another embodiment of the present disclosure, as illustrated in FIG. 14, the wet processing solution drive device 8 comprises a connecting frame 81 and a plurality of ducts 84 connected to the connecting frame 81. The plurality of ducts 84 are juxtaposed in the plane parallel to the side wall S provided with the opening 15. A plurality of nozzles (not illustrated) are disposed on each duct 84 in an equidistant manner, and are open towards the side walls S provided with the openings 15. Thus, the plurality of nozzles can be arranged in an array in the plane parallel to the side wall S provided with the opening 15. During the wet processing, the wet processing solution L can flow in the duct 84 and be sprayed towards the substrate 3 disposed on the opening 15 of the side wall S through the nozzles. The connecting frame 81 can be connected to the drive device via the slide bar 83. The drive device can drive the connecting frame 81, the plurality of ducts 84, and the plurality of nozzles to move in the plane parallel to the side wall S, for instance, performing reciprocating movement along the horizontal direction or the vertical direction, so as to uniformly spray the wet processing solution L onto the surface to be wet processed of the substrate 3.

According to another embodiment of the present disclosure, the wet processing solution drive device 8 can comprise both a plurality of blades 82 and a plurality of ducts 84 provided with nozzles. In this configuration, the movement of the blades 82 and the spraying action of the nozzles can produce a collaborative effect to better drive the flow of the wet processing solution for making the wet processing more uniformly.

In order to make the wet processing even more uniformly, the wet processing solution drive device 8 can be arranged as close as possible to the side wall S provided with the opening 15. For instance, the distance between the wet processing solution drive device 8 and the side wall can be in a range from 2 mm to 4 mm.

Figure 15:
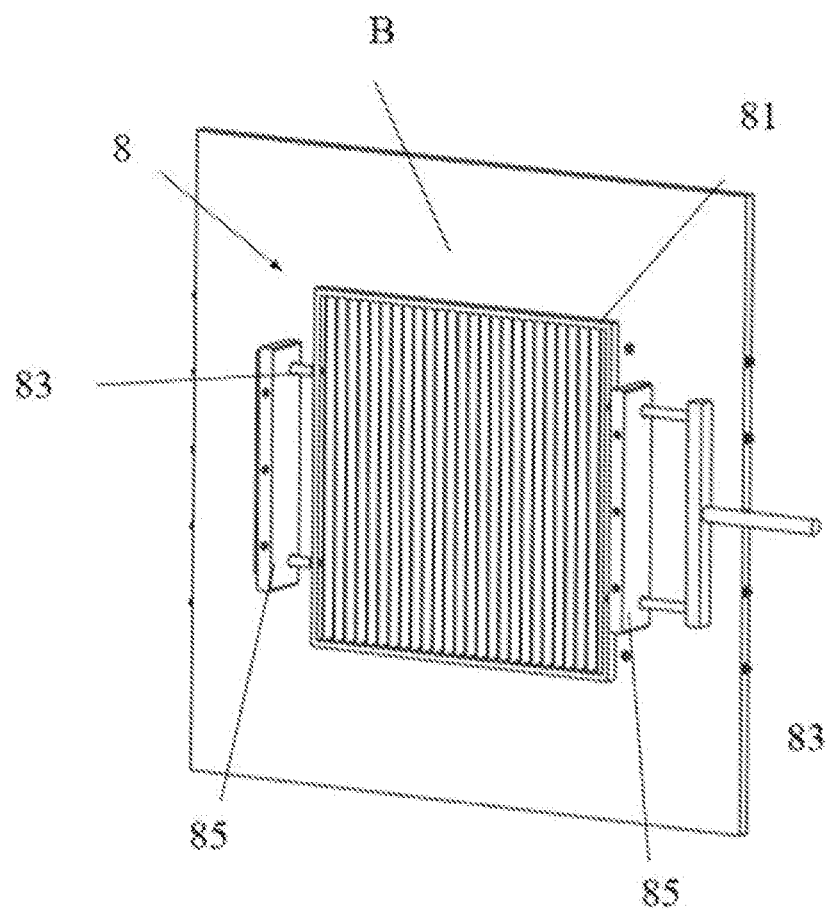
FIG. 15 is a schematic diagram of a wet processing solution drive device mounted to a side wall in one embodiment of the present disclosure.

In some examples, the wet processing solution drive device 8 can be mounted to the side wall S provided with the opening 15. In the embodiment as illustrated in FIG. 15, holders 85 for the wet processing solution drive device 8 can be disposed on the inner side of the side wall S. The holder 85 is roughly perpendicular to the side wall S and protrudes towards the inside of the tank body 1. The holders 85 are arranged on both sides of the wet processing solution drive device 8. The holders 85 can be provided with a through hole, and the slide bar 83 of the wet processing solution drive device 8 can be inserted into and supported by the through hole. The holders 85 have the dual function of holding the wet processing solution drive device 8 and guiding the movement of the wet processing solution drive device 8. Due to this configuration, the movement process of the wet processing solution drive device 8 can be implemented in a more stable manner, and the distance from the wet processing solution drive device 8 to the substrate to be wet processed 3 can be accurately controlled.

The operation method of the wet processing apparatus will be described below and is used for performing wet processing treatment on the substrate to be wet processed 3.

Firstly, placing the substrate 3 on the outer side of the side wall and at the position of the opening, and operating the fixing device 2 to fix the substrate 3.

In some examples, the wet processing apparatus 1 comprises a substrate mounting plate 6 fixed to the outer side of the side wall, the substrate mounting plate 6 comprises a hole 65 and a substrate mounting area 6A arranged around the hole 65, and the position of the hole 65 corresponds to the position of the opening. In this case, the step of operating the fixing device 2 to fix the substrate 3 further comprises: operating the fixing device 2 to fix the substrate 3 to the substrate mounting plate 6.

Secondly, performing wet processing treatment on the substrate 3.

In some examples, the wet processing apparatus 1 comprises a wet processing solution drive device 8 being disposed in the tank body 1 and facing the opening, and the wet processing solution drive device 8 is configured to drive the wet processing solution to flow towards the opening. In this case, the step of performing wet processing treatment on the substrate 3 can comprise: using the wet processing solution drive device 8 to drive the wet processing solution to flow towards the substrate 3.

Figure 16:
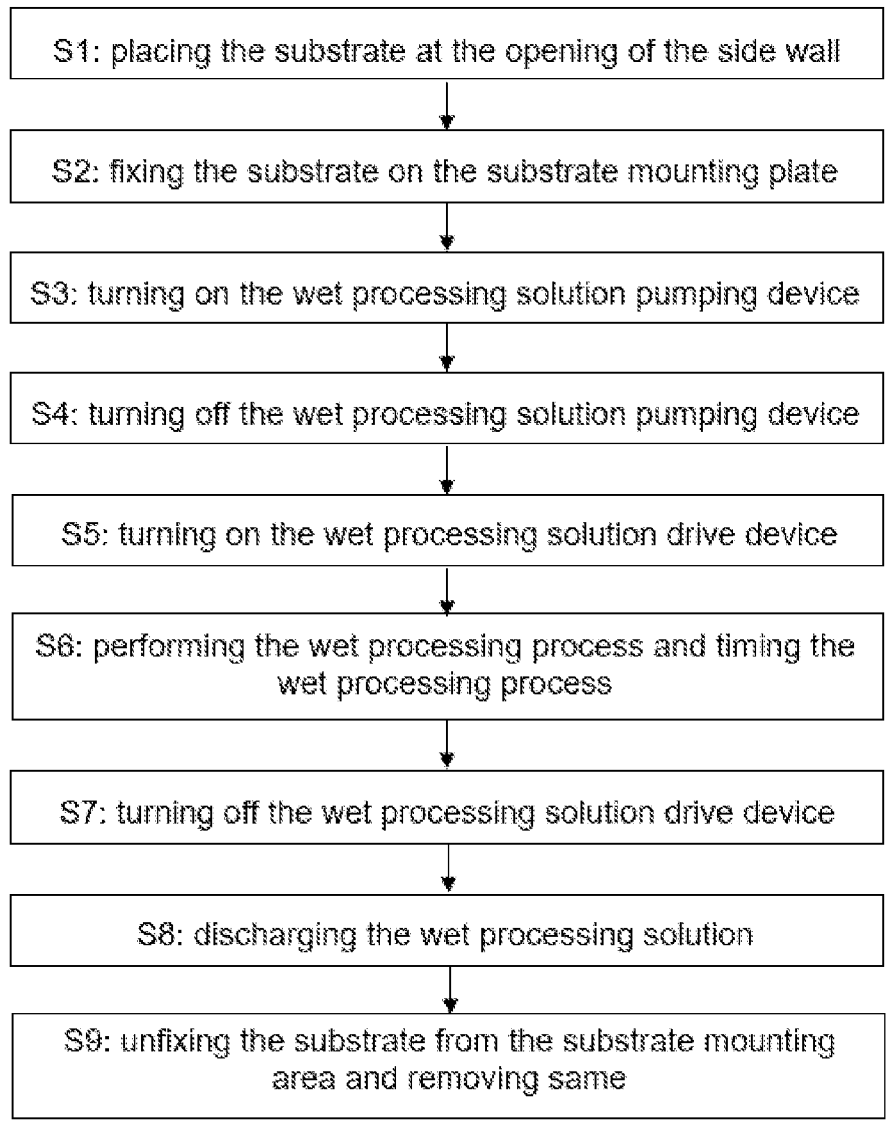
FIG. 16 is a schematic diagram of an operation method of the wet processing apparatus, provided by one embodiment of the present disclosure.

FIG. 16 illustrates an operation method of the wet processing apparatus 1 provided by one embodiment of the present disclosure. The method comprises:

S1: placing the substrate 3 on the outer side of the side wall S and at the position of the opening 15; and S2: operating the fixing device 2 to fix the substrate 3 on the substrate mounting plate 6.

For instance, the first driving mechanism 71 is operated at first so that the clamping plate 22 can move from the retraction position to the extension position and the clamping end 24 of the clamping plate 22 can move to the position above the substrate mounting area 6A, and then the second driving mechanism 72 is operated so that the supporting plate 21 can rotate from the inclination position to the parallel position and the clamping end 24 of the clamping plate 22 can apply a pressure to the substrate 3 in the substrate mounting area 6A.

S3: turning on a wet processing solution pumping device 8 to inject the wet processing solution L into the tank body 1 and allow the wet processing solution L to contact at least a part of the substrate 3.

S4: turning off the wet processing solution pumping device, and stopping injecting the wet processing solution into the tank body 1.

S5: turning on the wet processing solution drive device 8 and drive the wet processing solution L to flow towards the surface to be wet processed of the substrate 3.

S6: performing the wet processing process and timing the wet processing process.

S7: turning off the wet processing solution drive device 8.

S8: discharging the wet processing solution from the tank body 1.

S9: operating the fixing device 2 to unfix the substrate 3 from the substrate mounting area 6A and detach the substrate 3 from the substrate mounting plate 6.

Further features of the present disclosure may be found in the claims, the drawings, and the description of the drawings. The features and combinations of features mentioned above in the description and the features and combinations of features which are further illustrated in the drawings and/or independently illustrated in the drawings are not only used for the respectively indicated combinations, but also for other combinations or for individual use, without departing from the scope of the present disclosure. The details of the present disclosure, which are not explicitly illustrated and explained in the drawings but are presented from the detailed description of the features through independent feature combinations are thus comprised and disclosed. Therefore, details and combinations of features that do not have all of the features of the originally formed independent claims should also be considered as disclosed.

The invention claimed is:

1. A wet processing apparatus for performing wet processing treatment on a substrate, comprising:
    a tank body comprising at least one side wall, the at least one side wall having an outer side and an opening extending from the inside to the outside of the tank body, the tank body being configured to accommodate a wet processing solution;
    a substrate mounting plate having an inner side that is fixed to the outer side of, and around the opening of, the at least one side wall of the tank body, a hole positioned in the substrate mounting plate to correspond to a position of the opening in the at least one side wall of the tank body, an outer side opposed to the inner side, and a substrate mounting area on the outer side of the substrate mounting plate arranged around the hole; and
    a fixing device comprising
    (1) at least one clamping piece arranged on a periphery of the hole of the substrate mounting plate configured to fix the substrate over the hole on the substrate mounting plate and at the opening of the at least one side wall of the tank body, the at least one clamping piece comprises a supporting plate that comprises a receiving slot, and a clamping plate that is inserted into and capable of sliding in the receiving slot, between a retracted position disposed on the substrate mounting area and away from the hole of the substrate mounting plate, and an extended position disposed on the substrate mounting area and near the hole of the substrate mounting plate, and
    (2) a second driving mechanism, wherein the second driving mechanism is configured to drive at least one part of the at least one clamping piece along a second direction perpendicular to the outer side of the substrate mounting plate on which the substrate is fixed, so that the at least one part of the at least one clamping piece applies a pressure towards the substrate mounting area.

2. The wet processing apparatus according to claim 1, wherein the fixing device is disposed at the outer side of the at least one side wall of the tank body.

3. The wet processing apparatus according to claim 1, wherein the fixing device is disposed on the substrate mounting plate.

4. The wet processing apparatus according to claim 1, wherein the fixing device comprises two or more clamping pieces arranged on a periphery of the hole of the substrate mounting plate.

5. The wet processing apparatus according to claim 1, wherein the fixing device comprises a first driving mechanism;
    wherein the first driving mechanism is configured to slide the clamping plate along a first direction from the retracted position, to the extended position, wherein the first direction is parallel to the outer side of the substrate mounting plate on which the substrate is fixed.

6. The wet processing apparatus according to claim 5, wherein the at least one clamping piece comprises a connecting plate disposed on the supporting plate and fixed to the first driving mechanism, the connecting plate comprises a cam slot extending in a direction between the first direction and a third direction to form an angle greater than 0° and less than 90° with the first direction, and a protrusion is fixed on the clamping plate and passes through the supporting plate to cooperate with the cam slot; and
    wherein the first driving mechanism is configured to drive the connecting plate along the third direction which is parallel to the outer side of the substrate mounting plate and perpendicular to the first direction, so that the protrusion moves in the cam slot along an extension direction of the cam slot, and the clamping plate slides in the receiving slot of the supporting plate along the first direction.

7. The wet processing apparatus according to claim 5, wherein the fixing device further comprises a pivotal shaft connected to a middle part of the supporting plate, the middle part being between an outer end portion of the supporting plate away from the clamping plate, and an inner end portion of the supporting plate near the clamping plate; wherein the second driving mechanism is configured to drive the outer end portion of the supporting plate to move away from the substrate mounting plate along the second direction, so that the supporting plate rotates about the pivotal shaft, the inner end portion of the supporting plate moves towards the substrate mounting plate along the second direction, and the clamping plate applies the pressure towards the substrate mounting area.

8. The wet processing apparatus according to claim 7, wherein the clamping plate comprises a cantilever element and a clamping end, the cantilever element is configured to be inserted into the receiving slot of the supporting plate, and the clamping end extends from an end of the cantilever element towards the substrate mounting plate and is configured to apply the pressure towards the substrate mounting plate; and wherein in a case that the supporting plate is parallel to the substrate mounting plate, a first distance between the pivotal shaft and the second driving mechanism measured in the first direction is greater than a second distance between the pivotal shaft and the clamping plate measured in the first direction.

9. The wet processing apparatus according to claim 8, wherein the first distance is twice the second distance.

10. The wet processing apparatus according to claim 5, wherein the clamping plate comprises a cantilever element and a clamping end, the cantilever element is configured to be inserted into the receiving slot of the supporting plate, and the clamping end extends from an end of the cantilever element towards the substrate mounting plate and is configured to apply the pressure towards the substrate mounting plate; and wherein the wet processing apparatus comprises at least one sealing element disposed in a first area of the substrate mounting plate around the hole, a second area of the at least one side wall around the opening, or a combination thereof, and a position at which the clamping end applies the pressure towards the substrate mounting plate at least partially overlaps with a position of the sealing element in the direction perpendicular to the substrate mounting plate.

11. The wet processing apparatus according to claim 10, wherein the clamping plate comprises a plurality of clamping ends, and positions at which the plurality of clamping ends apply the pressure towards the substrate mounting plate are at least partially overlapped with the position of the sealing element in the second direction perpendicular to the outer side of the substrate mounting plate.

12. The wet processing apparatus according to claim 1, wherein the wet processing apparatus further comprises a cleaning solution conduit at a bottom wall of the tank body for transferring a cleaning solution.

13. The wet processing apparatus according to claim 1, further comprising a wet processing solution drive device disposed in the tank body and facing the opening, wherein the wet processing solution drive device is configured to drive the wet processing solution to flow towards the opening.

14. The wet processing apparatus according to claim 1, further comprising at least one sealing element disposed in a first area of the substrate mounting plate around the hole, a second area of the at least one side wall around the opening, or a combination thereof.

15. The wet processing apparatus of claim 14, further comprising a pressure detecting hole aligned with the at least one sealing element for detecting an air pressure around the at least one sealing element.

16. An operation method of the wet processing apparatus according to claim 1, comprising the steps of:

placing the substrate on the substrate mounting plate and at the opening, and operating the fixing device to fix the substrate; and performing the wet processing treatment on the substrate.

17. The method according to claim 16, wherein the substrate mounting plate is provided with a hole and a substrate mounting area distributed around the hole, and a position of the hole corresponds to a position of the opening; and wherein placing the substrate on the substrate mounting plate and at the position of the opening and operating the fixing device to fix the substrate comprises:

operating the fixing device to fix the substrate on the substrate mounting plate.

\* \* \* \* \*